United States Patent
Zhu et al.

(10) Patent No.: US 8,809,955 B2
(45) Date of Patent: Aug. 19, 2014

(54) SEMICONDUCTOR STRUCTURE AND METHOD FOR MANUFACTURING THE SAME

(75) Inventors: Huilong Zhu, Poughkeepsie, NY (US); Binneng Wu, Beijing (CN); Weiping Xiao, Beijing (CN); Hao Wu, Beijing (CN); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 384 days.

(21) Appl. No.: 13/379,357

(22) PCT Filed: Apr. 26, 2011

(86) PCT No.: PCT/CN2011/073304
§ 371 (c)(1),
(2), (4) Date: Dec. 20, 2011

(87) PCT Pub. No.: WO2012/094858
PCT Pub. Date: Jul. 19, 2012

(65) Prior Publication Data
US 2012/0267725 A1    Oct. 25, 2012

(30) Foreign Application Priority Data
Jan. 14, 2011    (CN) .......................... 2011 1 0008002

(51) Int. Cl.
*H01L 29/786*    (2006.01)
*H01L 21/8236*    (2006.01)
*H01L 29/10*    (2006.01)
*H01L 29/66*    (2006.01)

(52) U.S. Cl.
CPC ...... *H01L 29/66537* (2013.01); *H01L 29/1045* (2013.01); *H01L 29/105* (2013.01); *H01L 29/66553* (2013.01); *H01L 29/66545* (2013.01)
USPC ........... 257/349; 257/404; 257/652; 438/289; 438/299; 438/306

(58) Field of Classification Search
CPC ............ H01L 29/1025; H01L 29/7838; H01L 29/66537; H01I 21/823807; H01I 21/823892; H01I 21/823814
USPC ......... 257/335, 349, 376, 402, 403, 404, 652; 438/289, 290, 291, 299, 306
See application file for complete search history.

(56) References Cited

U.S. PATENT DOCUMENTS 6,410,394 B1 *    6/2002    Shao et al. .................... 438/289
6,562,687 B1    5/2003    Deleonibus et al.

(Continued)

FOREIGN PATENT DOCUMENTS

CN    1825552 A    8/2006
CN    101066569 A    11/2007
WO    WO 2009/046239    *    4/2009

OTHER PUBLICATIONS

International Search Report from PCT/CN2011/073304 dated Oct. 27, 2011 (5 pages).

(Continued)

*Primary Examiner* — Colleen Matthews
*Assistant Examiner* — Quovaunda V Jefferson
(74) *Attorney, Agent, or Firm* — Osha Liang LLP (57) ABSTRACT

Semiconductor structures and methods for manufacturing the same are disclosed. The semiconductor structure comprises: a gate stack formed on a semiconductor substrate; a super-steep retrograde island embedded in said semiconductor substrate and self-aligned with said gate stack; and a counter doped region embedded in said super-steep retrograde island, wherein said counter doped region has a doping type opposite to a doping type of said super-steep retrograde island. The semiconductor structures and the methods for manufacturing the same facilitate alleviating short channel effects.

13 Claims, 5 Drawing Sheets

(56) References Cited

U.S. PATENT DOCUMENTS

| | | | |
|---|---|---|---|
| 6,875,680 B1 | 4/2005 | Park | |
| 7,067,880 B2* | 6/2006 | Juengling et al. | 257/345 |
| 7,153,732 B1 | 12/2006 | Kim | |
| 2002/0033511 A1* | 3/2002 | Babcock et al. | 257/408 |
| 2003/0216016 A1* | 11/2003 | Oh | 438/546 |
| 2006/0154428 A1* | 7/2006 | Dokumaci | 438/302 |
| 2011/0256683 A1* | 10/2011 | Zhu et al. | 438/290 |
| 2012/0112249 A1* | 5/2012 | Yin et al. | 257/288 |

OTHER PUBLICATIONS

Written Opinion from PCT/CN2011/073304 dated Oct. 27, 2011 (4 pages).

Office Action in counterpart Chinese Patent Application No. 201110008002.1 issued Jan. 21, 2014 (7 pages).

* cited by examiner

SEMICONDUCTOR STRUCTURE AND METHOD FOR MANUFACTURING THE SAME

CROSS-REFERENCE TO RELATED APPLICATION

This application is a National Phase application of, and claims priority to, No. PCT/CN2011/073304, filed on Apr. 26, 2011, entitled "SEMICONDUTOR STRUCTURE AND METHOD FOR MANUFACTURING THE SAME", which claims priority to the Chinese Patent Application No. 201110008002.1, filed on Jan. 14, 2011. Both the PCT Application and Chinese Application are incorporated herein by reference in their entireties.

TECHNICAL FIELD

The present disclosure relates generally to semiconductor manufacturing technology, and in particular, to semiconductor structures and methods for manufacturing the same.

BACKGROUND

One important trend of integrated circuit technology is scaling down of metal-oxide-semiconductor field effect transistors (MOSFETs) for achieving a higher integration level and a lower manufacturing cost. However, it is well known that the reduction of MOSFET sizes will incur short channel effects.

It is well known that a thickness of a depletion layer may be reduced by a super-steep retrograde well (SSRW), which in turn suppresses the short channel effects. The super-steep retrograde well is an ion implanted region which is located at a depth beneath a surface of a semiconductor layer in which a semiconductor device is formed.

The super-steep retrograde well is usually formed before a gate electrode and source/drain regions are formed. However, the super-steep retrograde well also exists in the source/drain regions, in addition to in the channel region. Dopants in the super-steep retrograde well may vary a doping type and/or a doping concentration of the source/drain regions. Consequently, it is difficult to obtain a thinned depletion layer. It is thus difficult to obtain a steeper abrupt junction. The super-steep retrograde well may have an unfavorable effect of suppressing the short channel effects.

SUMMARY OF THE DISCLOSURE

The object of the present disclosure is to provide semiconductor structures and methods for manufacturing the same for alleviating the short channel effects.

According to one aspect of the present disclosure, there is provided a semiconductor structure, the semiconductor structure comprises:
  a gate stack formed on a semiconductor substrate;
  a super-steep retrograde island embedded in said semiconductor substrate and self-aligned with said gate stack; and
  a counter doped region embedded in said super-steep retrograde island, wherein said counter doped region has a doping type opposite to said super-steep retrograde island.

In the solution of the present disclosure, the super-steep retrograde island (SSRI) is formed as being self-aligned with the gate stack. The dopant for the super-steep retrograde island is provided only in the channel region of the semiconductor device, but not in the source/drain regions of the semiconductor device. Consequently, the dopant has a reduced influence on a doping type of the source/drain regions. It facilitates to obtain a thinned depletion layer. It thus facilitates to obtain a steeper abrupt junction. The super-steep retrograde island has a favorable effect of suppressing the short channel effects. The counter doped region is embedded in the super-steep retrograde island and has a doping type opposite to the super-steep retrograde island. Consequently, a doping profile of the super-steep retrograde island may be adjusted by the counter doped region. For example, the portion of the super-steep retrograde island that overlaps with the counter doped region has a low doping concentration. It facilitates to flexibly adjust the threshold voltage of the semiconductor device.

According to another aspect of the present disclosure, there is provided a method for manufacturing a semiconductor structure is provided, comprising:
  forming a dummy gate, spacers, and an insulating layer on a semiconductor substrate, wherein said dummy gate is surrounded by said spacers and said insulating layer adjoins said spacers and exposes said dummy gate;
  removing said dummy gate to form an opening;
  implanting a first dopant through said opening to form a super-steep retrograde island in said semiconductor substrate;
  forming an auxiliary mask layer in said opening, wherein said auxiliary mask layer covers at least sidewalls of said opening;
  implanting a second dopant through said opening in which said auxiliary mask layer is formed, said second dopant having a doping type opposite to said first dopant,
  wherein in the case where said auxiliary mask layer covers the sidewalls of said opening and exposes the bottom of said opening, a first counter doped region is formed in said semiconductor substrate by said second dopant;
  wherein in the case where said auxiliary mask layer covers the sidewalls and the bottom of said opening, either said second dopant is blocked by said auxiliary mask layer, or a second counter doped region is formed in said super-steep retrograde island by said second dopant, and said second counter doped region has a doping concentration smaller than a doping concentration of said first counter doped region.

In the method of the present disclosure, a first dopant is implanted through an opening after the opening is formed, for forming a self-aligned super-steep retrograde island (SSRI). The first dopant is provided only in the channel region of the semiconductor device, but not in the source/drain regions of the semiconductor device. Consequently, the first dopant has a reduced influence on a doping type of the source/drain regions. It facilitates to obtain a thinned depletion layer. It thus facilitates to obtain a steeper abrupt junction. The super-steep retrograde island has a favorable effect of suppressing the short channel effects. An auxiliary dielectric layer is formed in the opening and covers at least the sidewalls of the opening. A second dopant, which has a doping type opposite to the first dopant, is implanted through the opening in which the auxiliary dielectric layer has been formed, to form a counter doped region. It facilitates to adjust a doping profile of the super-steep retrograde island by the counter doped region. For example, in the case where the auxiliary dielectric layer covers the sidewalls of the opening and exposes the bottom of the opening, the first counter doped region is formed to lower a doping concentration of the portion of super-steep retrograde island that is self-aligned with the opening in which the auxiliary dielectric layer is formed; in the case where the auxiliary dielectric layer covers the sidewalls and the bottom of the opening, the super-steep halo has either unchanged doping profile, or has a doping concentration which is lowered by the second counter doped region, to an extend less than the case where the bottom of the opening is exposed. It facilitates to flexibly adjust the threshold voltage of the semiconductor device.

BRIEF DESCRIPTION OF THE DRAWINGS

The above and other objects, features and advantages of the present disclosure will become clearer from the following description for preferred embodiments of the present disclosure, with reference to the attached drawings, in which.

DETAILED DESCRIPTION

Hereinafter, the present disclosure will be described with those preferred embodiments in connection with the attached drawings. However, it should be understood that the description is only illustrative, but not intended to limit the protection scope.

Furthermore, the description for those well-known structures and technologies are omitted so as to not unnecessarily obscure concepts of the present disclosure. For the purpose of clarity, various components in the attached drawings are not drawn to scale.

It should be understood that for a device structure, in a case that one layer or region are described as being located "on" or "above" another layer or region, it means that the one layer or region is on the another layer or region, either directly or with other layers or regions between the one layer or region and the another layer or region. Moreover, if the device structure is turned over, the one layer or region will be located "under" or "beneath" the another layer or region.

In a case that the one layer or one region is directly on the another layer or region, the expressions will be "directly on" or "on and adjacent to . . . " herein.

Some particular details of the present disclosure will be described below, such as an exemplary semiconductor structure, material, dimension, process step and fabricating method of the device, for a better understanding of the present disclosure. Nevertheless, it should be understood by one skilled person in the art that these details are not always essential for but may be varied in a specific implementation of the present disclosure.

Unless the context clearly indicates otherwise, each part of the semiconductor device may be made of material(s) well known to one skilled person in the art.

Hereinafter, one embodiment of method for manufacturing the semiconductor structure will be described in reference to FIGS. 1-10.

Figure 1:
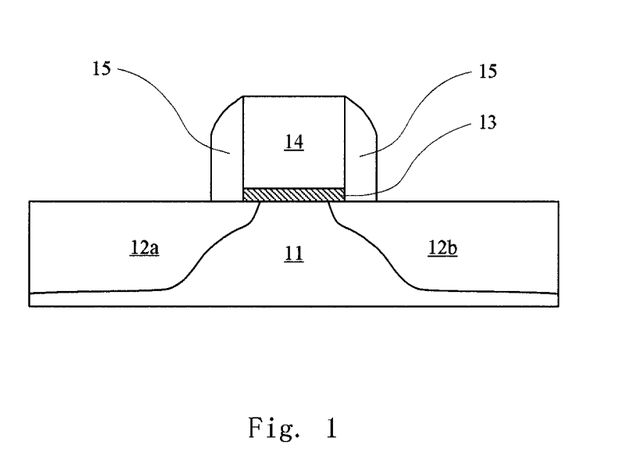
FIGS. 1-10 are cross-sectional views schematically showing intermediate structures formed in various steps according to an embodiment of method for manufacturing a semiconductor structure of the present disclosure, respectively.

FIG. 1 shows an initial structure for carrying out the method of the present disclosure. In previous steps (not shown), source/drain regions 12a and 12b have been formed in the semiconductor substrate 11, and an dummy gate stack has been formed on the top of the semiconductor substrate 11 between the source/drain regions 12a and 12b. In this embodiment, the dummy gate stack may comprise a dummy gate 14 and a dummy gate dielectric layer 13 (in other embodiments, the dummy gate stack may comprise only the dummy gate 14). Furthermore, first spacers 15 surrounding the dummy gate stack have been formed.

The semiconductor substrate may be made of any suitable materials used for semiconductor substrate, for example, Group IV semiconductor (such as Si, Ge, SiGe or SiC), or Group III-V semiconductor (such as GaAs, InP or GaN). The semiconductor substrate may be a bulk silicon substrate or a top semiconductor layer of an SOI wafer. In view of design requirements for semiconductor devices (for example, conductivity types of MOSFETs), the semiconductor substrate per se may be doped. The semiconductor substrate may comprise optional epitaxial layers, such as a stress layer for applying stress.

The dummy gate 14 may be a metal layer, a doped polysilicon layer, or a stacked gate conductor comprising a metal layer and a doped polysilicon layer. The dummy gate 14 may also be an amorphous silicon layer and a doped or undoped insulator layer, such as a doped or undoped silicon oxide layer or silicon nitride layer.

The dummy gate dielectric layer 13 may be made of silicon oxide or any materials (for example, a high dielectric constant (high-K) material) having a dielectric constant which is higher than that of silicon oxide. For example, the dummy gate dielectric layer 13 may be made of oxides, nitrides, oxynitrides, silicates, aluminates, titanates, or the like. The oxides include for example silicon oxide, hafnium-based materials (for example, $HfO_2$, HfSiO, HfSiON, HfTaO, HfTiO, or HfZrO), $ZrO_2$, $Al_2O_3$, $TiO_2$, and $La_2O_3$. The nitrides include for example silicon nitride. The silicates include for example $HfSiO_x$. The aluminates include for example $LaAlO_3$. The titanates include for example $SrTiO_3$. The oxynitrides include for example SiON. Additionally, the dummy gate dielectric layer 13 may be made not only of materials which are well known to those skilled in the art, but also of future-developed materials for the gate dielectric layer.

In this embodiment, for example, the semiconductor substrate 11 is a bulk silicon substrate; the dummy gate dielectric layer 13 is made of silicon oxide; the dummy gate 14 is made of doped polysilicon; and the first spacer 15 is made of silicon nitride. In other embodiments, the first spacer 15 may be of a stack structure, and adjacent layers of the stack structure may be made of different materials.

The source/drain regions 12a and 12b may preferably comprise extensions which extend to be beneath the dummy gate stack, as shown in FIG. 1. The extensions reduce a junction depth of the source/drain regions at both ends of the channel region, which facilitates to suppress the short channel effects.

Figure 2:
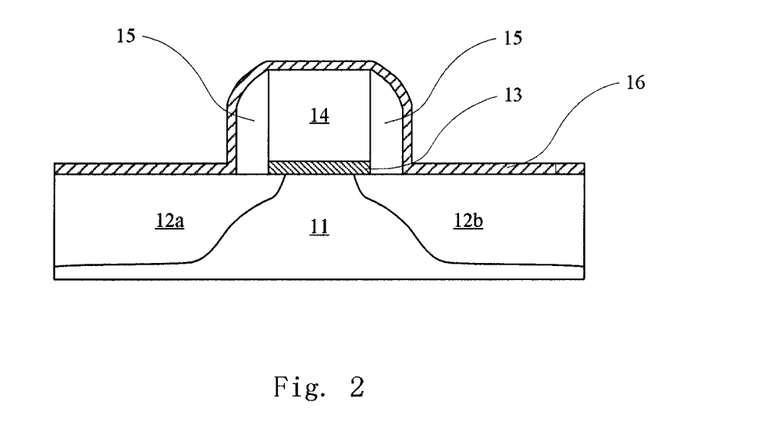

Next, an auxiliary dielectric layer 16 (for example, a silicon nitride layer) is formed on the whole surface of the semiconductor structure by deposition process, such as PVD, CVD, atomic layer deposition, or sputtering, etc., as shown in FIG. 2. The auxiliary dielectric layer 16 may have a thickness of about 10 nm-20 nm.

Figure 3:
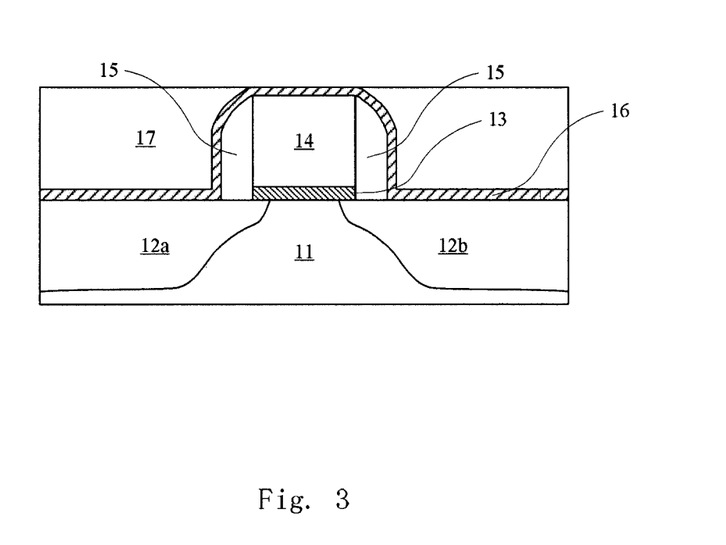

Next, an inter-layer dielectric layer 17 (for example, a doped silicon oxide layer, including BSG, BPSG, PSG or FSG, etc.) is deposited on the whole surface of the semiconductor structure by the above deposition process. The inter-layer dielectric layer 17 fills recesses around the dummy gate stack. The inter-layer dielectric layer 17 is planarized (for example, by chemical-mechanical polish, CMP) to obtain a planar structure surface. During planarization, the auxiliary dielectric layer 16, which is previously formed, may function as a stop layer. The portion of the inter-layer dielectric layer 17 located on top of the dummy gate stack is thus removed, and the corresponding portion of the auxiliary dielectric layer 16 located on the top of the dummy gate stack is exposed, as shown in FIG. 3.

Figure 4:
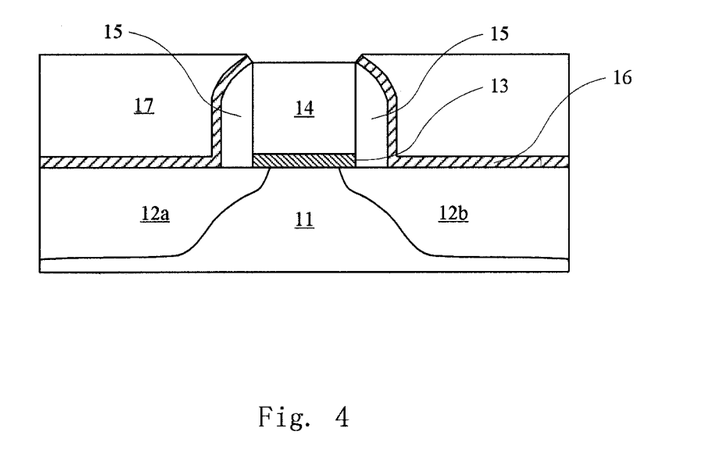

Next, the exposed portion of the auxiliary dielectric layer 16 is selectively removed by wet etching or dry etching with the inter-layer dielectric layer 17 as a mask, such that the dummy gate 14 is exposed, as shown in FIG. 4.

Next, with the inter-layer dielectric layer 17 and the auxiliary dielectric layer 16 as masks, the dummy gate 14 is selectively removed by wet etching or dry etching, such that the dummy gate dielectric layer 13 is exposed. The first opening 18 is thus formed. A width of the first opening 18 is denoted as L. In other embodiments, the dummy gate dielectric layer 13 may also be removed. In the case where the dummy gate dielectric layer 13 remains, the dummy gate dielectric layer 13 is used as a shield layer for ion implantation during subsequent ion implantation, which reduces damages to a surface of the semiconductor substrate 11 by ion implantation. In the case where there is no dummy gate dielectric layer 13, the semiconductor substrate 11 is exposed.

Figure 5:
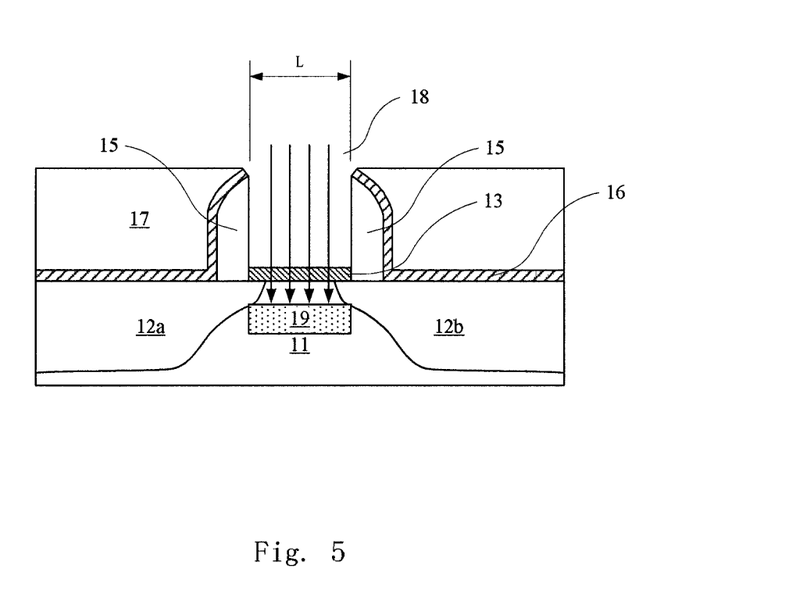

Next, with the first opening 18 a window, the first ion implantation is performed for implanting a first dopant. An individual super-steep retrograde island 19 is formed at a depth beneath the first opening 18, as shown in FIG. 5. The shortest distance between the super-steep retrograde island 19 where it has a doping concentration of about $1\times10^{16}/cm^3$, $2\times10^{16}/cm^3$, $5\times10^{16}/cm^3$, $1\times10^{17}/cm^3$, $2\times10^{17}/cm^3$, $5\times10^{17}/cm^3$, $1\times10^{18}/cm^3$, $2\times10^{18}/cm^3$ or $5\times10^{18}/cm^3$, and a surface of said semiconductor substrate on which the gate stack is formed is in a range from one third to one half of a gate length of a semiconductor device comprising the super-steep retrograde island 19. The super-steep retrograde island 19 has a doping type opposite to a conductivity type of the semiconductor device comprising this super-steep retrograde island 19. For an n-type device, a p-type dopant is used for forming the super-steep retrograde island 19. For a p-type device, an n-type dopant is used for forming the super-steep retrograde island 19. For example, the p-type dopant may be one of B and In or the combination thereof, wherein the combination thereof facilitates to obtain a steeper abrupt junction. For example, the n-type dopant may be one of As, P and Sb or the combination thereof, wherein the combination thereof facilitates to obtain a steeper abrupt junction. For example, the super-steep retrograde island 19 may have a doping concentration of about $1\times10^{16}/cm^3$-$1\times10^{19}/cm^3$. In such case, the super-steep retrograde island 19 is self-aligned with the first opening 18, and therefore the super-steep retrograde island 19 may also have a width of about L.

Next, an auxiliary mask layer 20 is formed on the whole surface of the semiconductor structure by the above deposition process. The auxiliary mask layer 20 may be an amorphous silicon layer, and may have a thickness d of about 5 nm-20 nm. For a semiconductor device with a long gate length (relatively, i.e. gate length L>2 d), this auxiliary mask layer 20 covers the sidewalls and the bottom of the first opening 18. Next, the auxiliary mask layer 20 is anisotropically etched without any other masks. That is, not only the portion of the auxiliary mask layer 20 located outside the first opening 18 is removed, but also the portion of the auxiliary mask layer 20 located on the bottom of the first opening 18 is removed. The remaining portion of the auxiliary mask layer 20 located on the sidewalls of the first opening 18 forms second spacers. The first opening 18 with the width of about L becomes a second opening with the width of about I, approximately satisfying I=L−2 d, as shown in FIG. 6.

Figure 6:
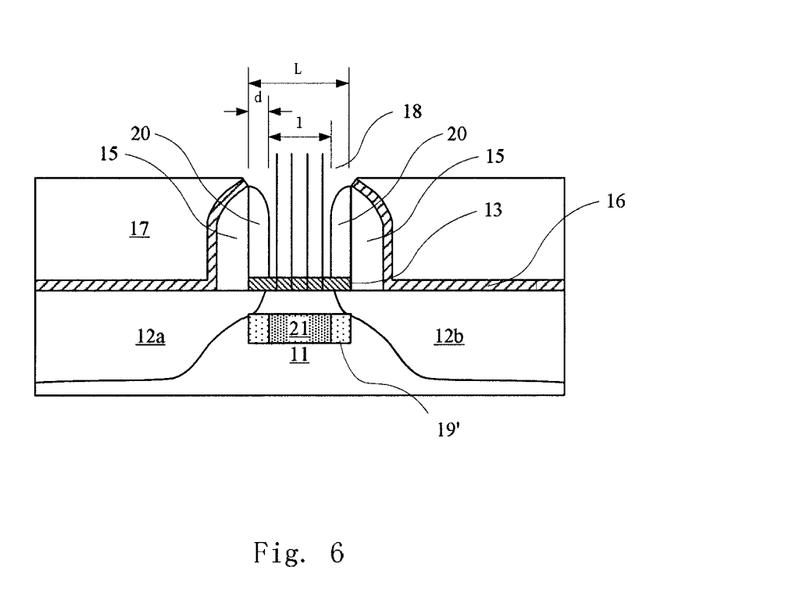

Next, with the second opening having a reduced width I as a window, a second ion implantation is performed for implanting a second dopant, to form a counter doped region 21 in the super-steep retrograde island 19, as shown in FIG. 6.

In such case, the counter doped region 21 is embedded in the super-steep retrograde island 19. The second ion implantation may be performed with an implantation depth equal to that of the first ion implantation, by controlling the power and dose of ion implantation. The counter doped region 21 may have a doping type the same as a conductivity type of the semiconductor device. For an n-type device, an n-type dopant is used. For a p-type device, a p-type dopant is used. For example, the p-type dopant may be one of B and In or the combination thereof, wherein the combination thereof facilitates to obtain a steeper abrupt junction. For example, the n-type dopant may be one of As, P and Sb or the combination thereof, wherein the combination thereof facilitates to obtain a steeper abrupt junction.

After the counter doped region 21 is formed, the dopants of the opposite doping types in the two ion implantations cancel to some extent, which significantly reduces an effective doping concentration of the previously formed super-steep retrograde island 19. In other words, the region occupied by the counter doped region 21 still appears to be p-type doped for an n-type device, and still appears to be n-type doped for a p-type device, except for that it has a doping concentration lower than a doping concentration in the super-steep retrograde island 19. Optionally, the region occupied by the counter doped region 21 may have an opposite doping type, in view of the requirement in the device design. For example, the region occupied by the counter doped region 21 appears to be n-type doped for an n-type device, and appears to be p-type doped for a p-type device.

The counter doped region 21 is self-aligned with the second opening, and may also have a width of about I. In such case, the super-steep retrograde island 19 and the counter doped region 21 together constitute a super-steep retrograde halo (SSRH) 19'.

The doping profile of the super-steep retrograde island 19 is adjusted by the counter doped region 21, which facilitates to flexibly adjust threshold voltage of the device.

It should be noted that the super-steep retrograde island 19 is formed by self-aligning with the first opening 18, and the counter doped region 21 is formed by self-aligning with the second opening. The spacing between the second opening and the first opening 18 (i.e. the second spacer) are arranged symmetrically. Therefore, the counter doped region 21 is embedded in the super-steep retrograde island 19, and centrally coincided with each other. In other words, in any plane parallel to a surface of the semiconductor substrate 11 on which the gate stack is formed, the distance between a boundary of the counter doped region 21 and a boundary of the super-steep retrograde island 19 is uniform. In the present application, the term "uniform" means variations less than a process tolerance.

Next, an annealing (such as laser annealing, rapid thermal annealing) is performed for a short time to activate various dopant implanted into the super-steep retrograde halo 19'.

Next, the second spacers may be selectively removed by wet etching.

Next, a high-K dielectric layer 22 and a replacement gate 23 are formed on the whole surface of the semiconductor structure by the above deposition process. For example, the high-K dielectric layer 22 may be made of the above high-k material of the dummy gate dielectric layer 13, such as hafnium-based material, silicate or aluminate, etc. For example, the replacement gate 23 may be made of the metal material for the dummy gate 14. The high-K dielectric layer 22 may have a thickness of about 1 nm-3 nm, whereas the replacement gate 23 may have a thickness sufficient for filling up the first opening 18.

It should be noted that the first spacers 15 may be removed after the replacement gate 23 is formed, and then a specific dielectric material, such as a stressing material, may fill the cavity which is formed after the first spacers 15 are removed. It facilitates to adjust the stress in the channel region of the device.

Figure 7:
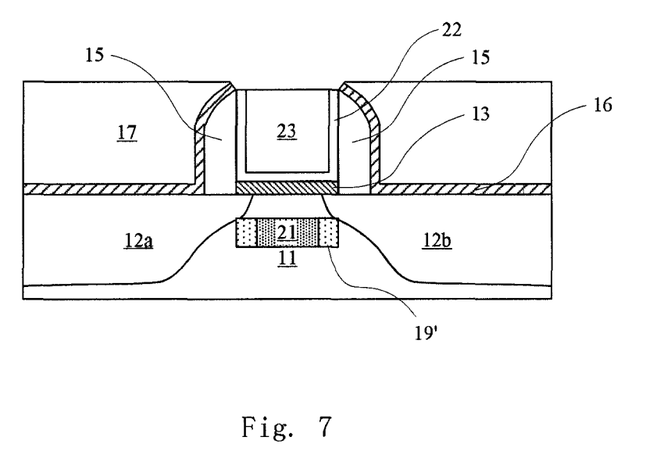

Next, CMP is performed on the high-K dielectric layer 22 and the replacement gate 23 to obtain a planar structure surface. In the present application, the term "planar", "flat" or "even" means that a difference between heights of any two points in a plane should be less than a process tolerance. During CMP, the previously formed inter-layer dielectric layer 17 can function as a stop layer, so that the portions of the high-K dielectric layer 22 and the replacement gate 23 outside the first opening 18 may be removed completely, as shown in FIG. 7.

Next, a passivation layer 24 (for example, silicon nitride) may be optionally formed on the whole planarized surface of the semiconductor structure by the above deposition process to protect various portions (for example, the replacement gate 23) of the semiconductor device beneath the passivation layer 24.

Figure 8:
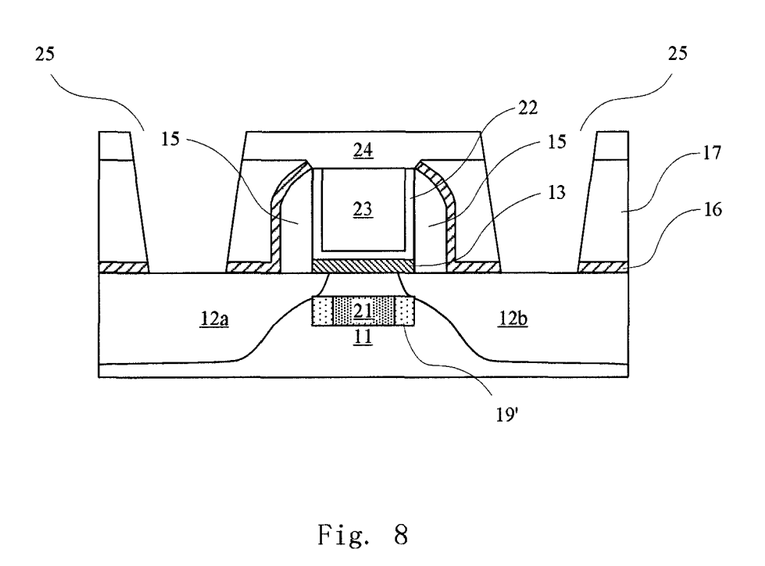

The passivation layer 24 and the inter-layer dielectric layer 17 previously formed under the passivation layer 24 constitute an inter-layer dielectric (ILD) layer in the resultant semiconductor device. Contact holes 25 are then formed in the inter-layer dielectric layer 17 to access the source/drain regions 12a, 12b, by the process well known to those skilled in the art, as shown in FIG. 8.

Figure 9:
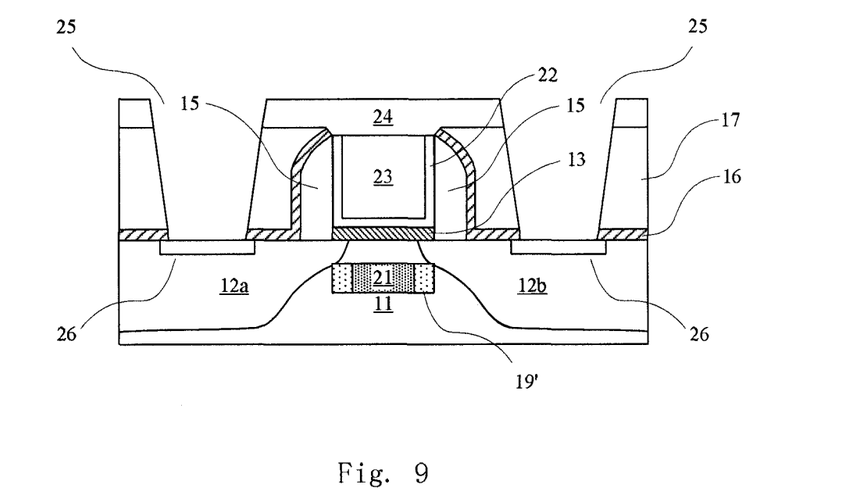

Next, a thin metal layer (for example, NiPt) is formed on the portions of the surface of the source/drain regions 12a, 12b that are exposed through the contact holes 25. A thermal annealing is performed so that the metal reacts with Si in the source/drain regions 12a, 12b to form a metallic silicide (for example, NiPtSi). Thus, at least parts of the thin metal layer are converted into the metallic silicide layers 26, and the un-reacted metal is removed, as shown in FIG. 9.

Figure 10:
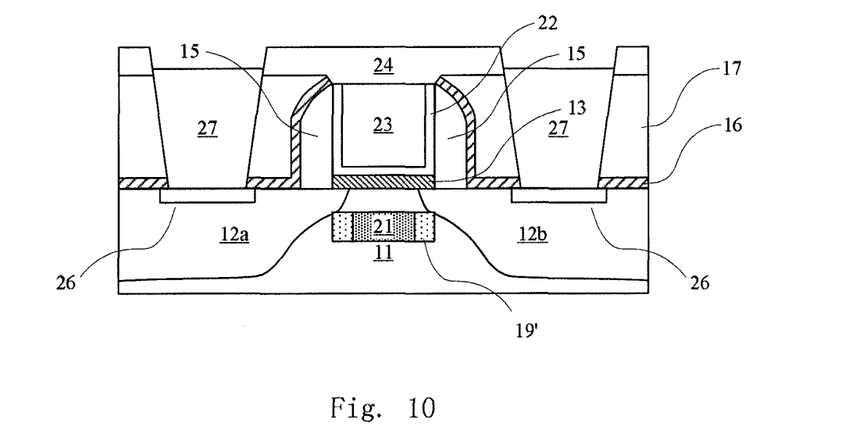

Next, contact plugs 27 are formed by a conventional damascene process, as shown in FIG. 10. The contact plugs 27 provide electrical connections between the source/drain regions 12a, 12b and external circuitry. For example, the damascene process may comprise the steps of forming a barrier layer (for example, a TiN layer with a thickness of about 1 nm-7 nm, not shown) and a contact metal which fills up the contact holes 25, performing CMP on the contact metal to completely remove the portion of the contact metal outside the contact holes 25.

After the steps illustrated by FIGS. 1-10, electrodes and wirings are formed on the top surface of the inter-layer dielectric layer 17 in the resultant semiconductor structure, as well known in the art. Other parts of the semiconductor device are thus formed.

Alternatively, for a semiconductor device with a short gate length (relatively, i.e. gate length L<2 d), after the super-steep retrograde island 19 is formed and further after the auxiliary mask layer 20 is formed to cover the sidewalls and the bottom of the first opening 18, the auxiliary mask layer 20 will fill up the first opening 18 because the auxiliary mask layer 20 has a thickness of about d. Therefore, the second opening cannot be formed by removing the portion of the auxiliary mask layer 20 located on the bottom of the first opening 18. Consequently, either a doping concentration of the super-steep retrograde island 19 might not be compensated due to the shield of the auxiliary mask layer 20, or a sub counter doped region might be still formed in the super-steep retrograde island 19 except for that the doping concentration of the sub counter doped region is less than the doping concentration of the counter doped region 21. After that, as described in the above embodiment where a semiconductor device has a long gate length, subsequent processes are further performed for a semiconductor device with a short gate length, after the second dopant is implanted: annealing to activate the dopant implanted into the super-steep retrograde island 19; forming the high-K dielectric layer 22 and the replacement gate 23; forming the passivation layer 24; and forming the contact holes 25, the metallic silicide layers 26 and the contact plugs 27. In such case, it facilitates to reduce the probability of short channel effects by the super-steep retrograde island 19, and it also facilitates to maintain the threshold voltage of the semiconductor device not being lowered to an unexpected level.

A semiconductor structure is also provided by the present disclosure, the semiconductor structure comprises:
  a gate stack formed on a semiconductor substrate;
  a super-steep retrograde island embedded in the semiconductor substrate and self-aligned with the gate stack; and
  a counter doped region embedded in the super-steep retrograde island, wherein the counter doped region has a doping type opposite to the super-steep retrograde island.

Preferably, the super-steep retrograde island may have a doping type opposite to a conductivity type of a semiconductor device comprising the super-steep retrograde island.

Preferably, the counter doped region may be centrally coincided with that of the super-steep retrograde.

Preferably, a depth of the super-steep retrograde island may be the same as that of the counter doped region.

Preferably, the shortest distance between the super-steep retrograde island where it has a doping concentration of about $1\times10^{16}/cm^3$, $2\times10^{16}/cm^3$, $5\times10^{16}/cm^3$, $1\times10^{17}/cm^3$, $2\times10^{17}/cm^3$, $5\times10^{17}/cm^3$, $1\times10^{18}/cm^3$, $2\times10^{18}/cm^3$ or $5\times10^{18}/cm^3$, and a surface of the semiconductor substrate on which the gate stack is formed may be in a range from one third to one half of a gate length of a semiconductor device comprising the super-steep retrograde island.

Preferably, the super-steep retrograde island and the counter doped region may be each doped with a doping element selected from a group consisting of boron, indium, phosphor, arsenic and antimony, or any combination thereof.

The arrangements, materials and methods for providing various portions in the embodiment of the semiconductor structure are the same as the above detailed description for the embodiments of method for manufacturing the semiconductor structure. Detailed description is omitted here for simplicity.

Although the disclosure has been described with reference to specific embodiments, the description is only illustrative of the disclosure, rather than exhausting and limiting the present disclosure. The description is not construed as limiting the disclosure. Various modifications and applications may occur for those skilled in the art without departing from the true spirit and scope of the disclosure.

We claim:
1. A semiconductor structure, comprising:
  a gate stack formed on a semiconductor substrate;
  a super-steep retrograde island embedded in said semiconductor substrate and self-aligned with said gate stack; and
  a counter doped region embedded in said super-steep retrograde island, wherein said counter doped region has a doping type opposite to said super-steep retrograde island.
2. The semiconductor structure according to claim 1, wherein said super-steep retrograde island has a doping type opposite to a conductivity type of a semiconductor device comprising said super-steep retrograde island.

3. The semiconductor structure according to claim 1, wherein said counter doped region is centrally coincided with that of said super-steep retrograde.

4. The semiconductor structure according to claim 1, wherein a depth of said super-steep retrograde island is the same as that of said counter doped region.

5. The semiconductor structure according to claim 1, wherein the shortest distance between said super-steep retrograde island where it has a doping concentration of about $1\times10^{16}/cm^3$, $2\times10^{16}/cm^3$, $5\times10^{16}/cm^3$, $1\times10^{17}/cm^3$, $2\times10^{17}/cm^3$, $5\times10^{17}/cm^3$, $1\times10^{18}/cm^3$, $2\times10^{18}/cm^3$ or $5\times10^{18}/cm^3$ and a surface of said semiconductor substrate on which said gate stack is formed is in a range from one third to one half of a gate length of a semiconductor device comprising said super-steep retrograde island.

6. The semiconductor structure according to claim 1, wherein said super-steep retrograde island and said counter doped region are each doped with a doping element selected from a group consisting of boron, indium, phosphor, arsenic and antimony, or any combination thereof.

7. A method for manufacturing a semiconductor structure, comprising:
   forming a dummy gate, spacers, and an insulating layer on a semiconductor substrate, wherein said dummy gate is surrounded by said spacers, and said insulating layer adjoins said spacers and exposes said dummy gate;
   removing said dummy gate to form an opening;
   implanting a first dopant through said opening to form a super-steep retrograde island in said semiconductor substrate;
   forming an auxiliary mask layer in said opening, wherein said auxiliary mask layer covers at least sidewalls of said opening;
   implanting a second dopant through said opening in which said auxiliary mask layer is formed, said second dopant having a doping type opposite to said first dopant;
   wherein in the case where said auxiliary mask layer covers the sidewalls of said opening and exposes the bottom of said opening, a first counter doped region is formed in said semiconductor substrate by said second dopant; and
   wherein in the case where said auxiliary mask layer covers the sidewalls and the bottom of said opening, said second dopant is either blocked by said auxiliary mask layer or forms a second counter doped region in said super-steep retrograde island, and said second counter doped region has a doping concentration smaller than that of said first counter doped region.

8. The method according to claim 7, wherein said first dopant has a doping type opposite to a conductivity type of a semiconductor device comprising said super-steep retrograde island.

9. The method according to claim 7, wherein the step of forming an auxiliary mask layer covering the sidewalls of said opening comprises:
   forming an auxiliary mask layer that covers the sidewalls and the bottom of said opening; and
   removing the portion of said auxiliary mask layer that covers the bottom of said opening, wherein said auxiliary mask layer is made of a material different from a material of said insulating layer.

10. The method according to claim 7, wherein after implanting a second dopant, the method further comprises:
    removing said auxiliary mask layer to reopen said opening; and
    forming a replacement gate in said opening.

11. The method according to claim 7, wherein an implantation depth of said second dopant is the same as that of said first dopant.

12. The method according to claim 7, wherein the step of implanting a first dopant is performed so that the shortest distance between said super-steep retrograde island where it has a doping concentration of about $1\times10^{16}/cm^3$, $2\times10^{16}/cm^3$, $5\times10^{16}/cm^3$, $1\times10^{17}/cm^3$, $2\times10^{17}/cm^3$, $5\times10^{17}/cm^3$, $1\times10^{18}/cm^3$, $2\times10^{18}/cm^3$ or $5\times10^{18}/cm^3$ and a surface of said semiconductor substrate on which said gate stack is formed is in a range from one third to one half of a gate length of a semiconductor device comprising said super-steep retrograde island.

13. The method according to claim 7, wherein said first dopant and said second dopant are each selected from a group consisting of boron, indium, phosphor, arsenic and antimony, or any combination thereof.

* * * * *